US012706276B2

(12) United States Patent
An et al.

(10) Patent No.: US 12,706,276 B2
(45) Date of Patent: Aug. 11, 2026

(54) SUBSTRATE PROCESSING APPARATUS AND SUBSTRATE PROCESSING METHOD

(71) Applicant: SEMES CO., LTD., Cheonan-si (KR)

(72) Inventors: Chan Yong An, Cheonan-si (KR); Ja Myung Gu, Cheonan-si (KR); Sang Moon Yoo, Hwaseong-si (KR); Tae Hoon Jo, Seoul (KR)

(73) Assignee: Semes Co., LTD., Cheonan-si (KR)

( * ) Notice: Subject to any disclaimer, the term of this patent is extended or adjusted under 35 U.S.C. 154(b) by 711 days.

(21) Appl. No.: 18/147,480

(22) Filed: Dec. 28, 2022

(65) Prior Publication Data

US 2023/0215693 A1 Jul. 6, 2023

(30) Foreign Application Priority Data

Dec. 30, 2021 (KR) ........................ 10-2021-0192279

(51) Int. Cl.
*H01J 37/32* (2006.01)

(52) U.S. Cl.
CPC .. *H01J 37/32155* (2013.01); *H01J 37/32091* (2013.01); *H01J 37/32642* (2013.01); *H01J 37/32522* (2013.01); *H01J 2237/334* (2013.01)

(58) Field of Classification Search
CPC ................................................. H01J 37/32155
See application file for complete search history.

(56) References Cited

U.S. PATENT DOCUMENTS 6,095,084 A * 8/2000 Shamouilian ..... H01J 37/32559 156/345.47
6,518,195 B1 2/2003 Collins et al.
6,524,432 B1 2/2003 Collins et al.
6,545,420 B1 4/2003 Collins et al.
6,572,732 B2 6/2003 Collins
6,623,596 B1 9/2003 Collins et al.
6,736,931 B2 5/2004 Collins et al.
6,790,311 B2 9/2004 Collins et al.
6,818,140 B2 11/2004 Ding
10,840,062 B2 11/2020 Nguyen et al.
2004/0163764 A1 8/2004 Collins et al.
(Continued)

FOREIGN PATENT DOCUMENTS

CN 107527785 A 12/2017
CN 211063348 U * 7/2020
(Continued)

OTHER PUBLICATIONS

Translation to Borth (CN 113646466) published Nov. 2021.*
(Continued)

*Primary Examiner* — John J Brayton
(74) *Attorney, Agent, or Firm* — Harness, Dickey & Pierce, P.L.C.

(57) ABSTRACT

The inventive concept provides a substrate processing apparatus. The substrate processing apparatus may include a chamber having an interior space, a support unit that supports a substrate in the interior space, a ring unit disposed on an edge region of the support unit when viewed from above, an impedance control unit electrically connected to the ring unit to control a flow or density of plasma in an edge region of the substrate and a filter unit disposed between the ring unit and the impedance control unit.

13 Claims, 4 Drawing Sheets

(56) References Cited

U.S. PATENT DOCUMENTS

| | | | | |
|---|---|---|---|---|
| 2014/0162462 | A1 | 6/2014 | Trachuck et al. | |
| 2023/0207294 | A1 * | 6/2023 | Jin | H01J 37/32541<br>156/345.28 |

FOREIGN PATENT DOCUMENTS

| | | | | | |
|---|---|---|---|---|---|
| CN | 112151348 | A | | 12/2020 | |
| CN | 112913140 | A | | 6/2021 | |
| CN | 113646466 | A | * | 11/2021 | H05K 9/0049 |
| EP | 0840350 | A2 | | 5/1998 | |
| JP | H10-241895 | A | | 9/1998 | |
| JP | 2017-228526 | A | | 12/2017 | |
| JP | 2021-044540 | A | | 3/2021 | |
| KR | 20040007351 | A | | 1/2004 | |
| KR | 10-1054558 | | | 8/2011 | |
| KR | 10-2018-0000291 | A | | 1/2018 | |
| KR | 20180000291 | A | * | 1/2018 | H01J 37/1471 |
| KR | 10-2020-0135114 | A | | 12/2020 | |
| KR | 102219568 | B1 | | 2/2021 | |
| KR | 102290910 | B1 | | 8/2021 | |
| WO | WO-2020/096723 | A1 | | 5/2020 | |
| WO | WO-2021158451 | A1 | | 8/2021 | |

OTHER PUBLICATIONS

Translation to Kellog (KR 20180000291) published Jan. 2018.*

Translation to Liu (CN 211063348) published Jul. 2020.*

Office Action dated Jan. 30, 2024 issued in corresponding Japanese Patent Application No. 2022-211393.

Office Action for Korean Application No. 10-2021-0192279 dated Apr. 9, 2024.

Chinese Office Action dated Apr. 2, 2026 issued in corresponding Chinese patent application No. 202211727746.3 and English translation thereof.

* cited by examiner

SUBSTRATE PROCESSING APPARATUS AND SUBSTRATE PROCESSING METHOD

CROSS-REFERENCE TO RELATED APPLICATIONS

A claim for priority under 35 U.S.C. § 119 is made to Korean Patent Application No. 10-2021-0192279 filed on Dec. 30, 2021, in the Korean Intellectual Property Office, the entire contents of which are hereby incorporated by reference.

BACKGROUND

Embodiments of the inventive concept described herein relate to a substrate processing apparatus and a substrate processing method.

To manufacture a semiconductor device, a substrate is subjected to various processes such as photolithography, etching, ashing, ion implantation, thin film deposition, and cleaning to form a desired pattern on the substrate. Among the processes, the etching process is a process of removing a selected heating region in a film formed on the substrate, and includes wet etching and dry etching. For the dry etching, an etching device using plasma is used. Plasma refers to an ionized gaseous state composed of ions or electrons, radicals, and the like. Plasma is generated by very high temperatures or strong RF Electromagnetic Fields. For the RF electromagnetic fields, an RF generator applies an RF voltage to one of electrodes opposite to each other. The RF power applied by the RF generator excites a process gas supplied into a space within a chamber to generate plasma.

Meanwhile, to uniformly remove a film formed on a substrate such as a wafer, it is important to uniformly deliver plasma to the substrate. That is, it is necessary to uniformly adjust the density of plasma on a top surface of the substrate. To this end, an impedance control unit transmits an RF signal to a conductive component (e.g., a coupling ring disposed under an edge region of the substrate) capable of adjusting the density of plasma in the chamber to control the density of plasma on the top surface of the substrate. Also, the impedance control unit includes a variable capacitor, and the density of plasma is controlled by adjusting the capacitance of the variable capacitor.

However, in this case, harmonics that may be generated by the impedance control unit may affect the density of plasma in a chamber through a conductive component. That is, uniformity of processing for the substrate may be deteriorated by the harmonics. In addition, the impedance of a cable that electrically connects the impedance control unit and the coupling ring to each other may change due to deterioration as the process progresses. Depending on the impedance of the cable that has been changed, the uniformity of processing for the substrate may be deteriorated.

SUMMARY

Embodiments of the inventive concept provide a substrate processing apparatus and a substrate processing method capable of efficiently processing a substrate.

In addition, embodiments of the inventive concept provide a substrate processing apparatus and a substrate processing method capable of improving uniformity of processing for a substrate by plasma.

In addition, embodiments of the inventive concept provide a substrate processing apparatus and a substrate processing method capable of matching substrate processing degrees between substrate processing apparatuses.

In addition, embodiments of the inventive concept provide a substrate processing apparatus and a substrate processing method capable of improving uniformity of processing for a substrate even when the impedance of a cable changes.

The problem to be solved by the inventive concept is not limited to the above-mentioned problems, and the problems not mentioned will be clearly understood by those of ordinary skill in the art to which the inventive concept belongs from the present specification and the accompanying drawings.

The inventive concept provides a substrate processing apparatus. The substrate processing apparatus may include a chamber having an interior space, a support unit that supports a substrate in the interior space, a ring unit disposed on an edge region of the support unit when viewed from above, an impedance control unit electrically connected to the ring unit to control a flow or density of plasma in an edge region of the substrate and a filter unit disposed between the ring unit and the impedance control unit.

According to an embodiment, the substrate processing apparatus may further include a cable that electrically connects the filter unit and the impedance control unit.

According to an embodiment, the filter unit may filter out harmonics generated by the impedance control unit to prevent the harmonics from being transferring to the ring unit.

According to an embodiment, the filter unit may filter out a third harmonic of the harmonics generated by the impedance control unit to prevent the third harmonic from being transferring to the ring unit.

According to an embodiment, the filter unit may include a housing having an accommodation space and a filter provided in the accommodation space to filter out the harmonics.

According to an embodiment, the housing may be formed with at least one heat dissipation hole that dissipates heat generated in the interior space.

According to an embodiment, the impedance control unit may include an RF power source that transmits an RF signal to the ring unit and an impedance control circuit having a variable capacitor for controlling a flow or density of the plasma generated above the ring unit.

According to an embodiment, the ring unit may include an edge ring disposed under the edge region of the substrate and/or in an outer periphery of the edge region of the substrate, and a coupling ring disposed under the edge ring, and the impedance control unit may be electrically connected to the coupling ring.

According to an embodiment, the coupling ring may include a ring electrode electrically connected to the impedance control unit and an insulating body that surrounds the ring electrode and made of an insulating material.

The inventive concept provides a substrate processing apparatus using plasma The substrate processing apparatus using plasma may include a chamber having an interior space, a support unit that supports the substrate in the interior space, a power source unit that generates the plasma in the interior space, a conductive component that adjusts a flow or density of the plasma transferred to the substrate, an impedance control unit electrically connected to the conductive component to adjust an impedance for controlling the flow or density of the plasma transferred to the substrate and a filter unit disposed between the impedance control unit and the conductive component.

According to an embodiment, the impedance control unit may include an RF power source that transmits an RF signal to the conductive component, and an impedance control circuit that adjusts the density of the plasma transferred to the substrate.

According to an embodiment, the filter unit may filter out a signal having a frequency of an integer multiple of the RF signal transmitted by the RF power source.

According to an embodiment, the filter unit may filter out a signal having a frequency three times a frequency of the RF signal transmitted by the RF power source.

According to an embodiment, the substrate processing apparatus may further include a RF cable that electrically connects the filter unit and the impedance control unit.

According to an embodiment, the filter unit may include a housing having an accommodation space, and a filter provided in the accommodation space to filter harmonics generated by the impedance control unit from being transmitted to the conductive component.

According to an embodiment, the housing may be formed with at least one heat dissipation hole that dissipates heat generated by the filter to outside.

According to an embodiment, the substrate processing apparatus may further include a ring unit disposed on an edge region of the support unit and having the conductive component.

According to an embodiment, the ring unit may include an edge ring that surrounds an edge region of the substrate or an outer periphery of the edge region of the substrate when viewed from above, and the conductive component may have a ring shape and is disposed below the edge ring.

The inventive concept provides a substrate processing method. The substrate processing method may include supplying a process gas to an interior space of a chamber and generating plasma by exciting the process gas to process the substrate, adjusting a density or flow of the plasma transferred to the substrate by adjusting a variable capacitor of an impedance control unit electrically connected to a ring unit disposed under an edge region of the substrate, and filtering out, by a filter, harmonics generated by the impedance control unit to prevent the harmonics from being transferred to the ring unit, the filter disposed between the impedance control unit and the ring unit.

According to an embodiment, the filter and the impedance control unit may be connected to each other through an RF cable, and the harmonics filtered out by the filter may have a frequency three times a frequency of the RF signal generated by the impedance control unit.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
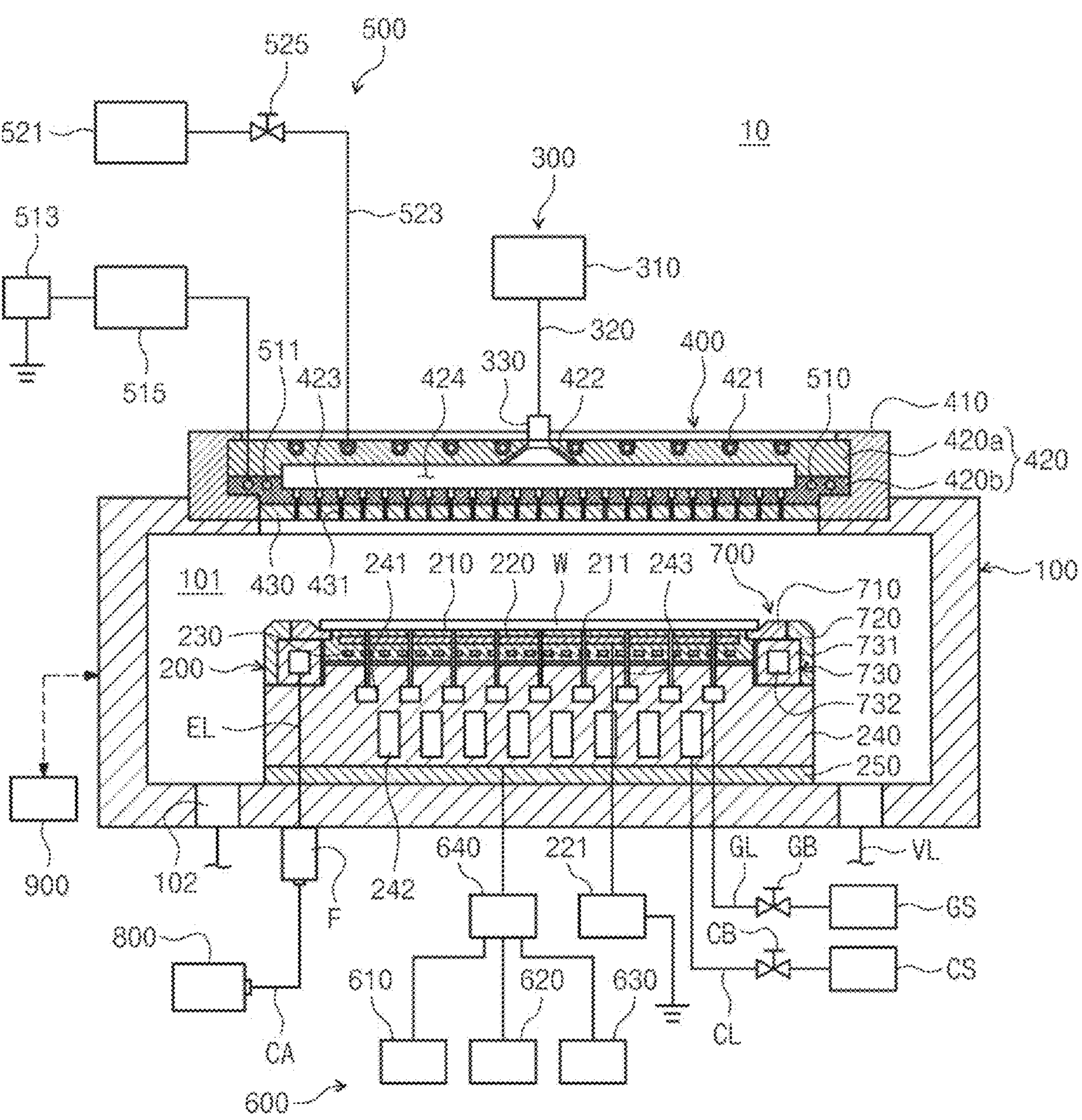
FIG. 1 is a view showing a substrate processing apparatus according to an embodiment of the inventive concept.

Other advantages and features of the inventive concept and methods for achieving them will be apparent with reference to embodiments described below in detail in conjunction with the accompanying drawings. However, the inventive concept is not limited to the embodiments disclosed below, but can be implemented in various forms, and these embodiments are to make the disclosure of the inventive concept complete, and are provided so that this disclosure will be thorough and complete and will fully convey the scope of the invention to those of ordinary skill in the art, which is to be defined only by the scope of the claims.

Unless defined herein, all terms (including technical or scientific terms) used herein have the same meaning as commonly accepted by general technology in the prior art to which the inventive concept belongs. The terms defined in general dictionaries may be construed as having the same meanings as those used in the related art and/or a text of the present application and even when some terms are not clearly defined, they should not be construed as being conceptual or excessively formal.

The terminology used herein is for the purpose of describing particular embodiments only and is not intended to be limiting of the inventive concept. The singular expressions include plural expressions unless the context clearly dictates otherwise. Throughout the description and claims of this specification, the words “comprise” and variations of the word, for example “comprising” and “comprises” etc., specify the presence of stated composition, ingredient, component, steps, operations and/or elements and do not preclude the presence or addition of one or more other compositions, ingredients, components, steps, operations and/or elements. In this specification, the term ‘and/or’ refers to each of the listed elements or various combinations thereof.

Terms such as first, second, and the like may be used to describe various elements, but the elements should not be limited by the terms. The terms are used merely for the purpose to distinguish a component from the other component. For example, without departing the scope of the disclosure, a first component may be referred to as a second component, and similarly, a second component may be referred to as a first component.

As used herein, singular forms may include plural forms as well unless the context clearly indicates otherwise. In addition, shapes, sizes, and the like of elements in the drawings may be exaggerated for clearer description.

As used throughout this specification, “~ unit” or “module” is a unit that processes at least one function or operation, and may refer to, for example, a software component or a hardware component such as FPGA or ASIC. However, “~ unit” or “module” is not meant to be limited to software or hardware. “~ unit” or “~ module” may be configured to reside in an addressable storage medium or may be configured to reproduce one or more processors.

As an example, “~ unit” or “module” may include components such as software components, object-oriented software components, class components and task components, processes, functions, properties, procedures, sub-routines, segments of program codes, drivers, firmware, microcodes, circuitry, data, databases, data structures, tables, arrays, and variables. A function provided by a component and "~ unit" or "module" may be performed separately by a plurality of components and "~ unit" or "module", or may be integrated with other additional components.

Hereinafter, embodiments of the inventive concept will be described in detail with reference to FIGS. 1 to 6.

FIG. 1 is a view schematically showing a substrate processing apparatus according to an embodiment of the inventive concept.

Referring to FIG. 1, a substrate processing apparatus 10 may process a substrate "W" using plasma. For example, the substrate processing apparatus 10 may perform an etching process on the substrate W. The substrate processing apparatus 10 may include a chamber 100, a support unit 200 (an example of a lower electrode unit), a gas supply unit 300, an upper electrode unit 400, a temperature control unit 500, a power source unit 600, a ring unit 700, an impedance control unit 800, a filter unit "F", and a controller 900.

The chamber 100 may have an interior space 101. The substrate "W" may be processed in the interior space 101. In the interior space 101, the substrate "W" may be processed by plasma. The substrate "W" may be etched by plasma. The plasma may be transferred to the substrate "W" to etch a film formed on the substrate W.

The inner wall of the chamber 100 may be coated with a material having excellent plasma resistance. The chamber 100 may be grounded. An inlet/outlet port (not shown) through which the substrate "W" is able to be carried in or out may be formed in the chamber 100. The inlet/outlet port may be selectively opened and closed by a door (not shown). While the substrate "W" is being processed, the interior space 101 may be closed by the inlet/outlet port. Also, while the substrate "W" is being processed, the interior space 101 may have a vacuum pressure atmosphere.

An exhaust hole 102 may be formed at the bottom of the chamber 100. The atmosphere of the interior space 101 may be exhausted through the exhaust hole 102. The exhaust hole 102 may be connected to an exhaust line VL providing a reduced pressure in the interior space 101. Process gas, plasma, process by-products and the like supplied to the interior space 101 may be exhausted to the outside of the substrate processing apparatus 10 through the exhaust hole 102 and the exhaust line VL. In addition, the pressure in the interior space 101 may be adjusted by the reduced pressure provided by the exhaust line VL. For example, the pressure in the interior space 101 may be adjusted by the gas supply unit 300 and the reduced pressure provided by the exhaust line VL, which will be described later. When the pressure in the interior space 101 is to be lowered, the reduced pressure provided by the exhaust line VL may be increased or the supply amount of the process gas supplied by the gas supply unit 300 per unit time may be reduced. Conversely, when the pressure in the interior space 101 is to be further increased, the reduced pressure provided by the exhaust line VL may be reduced or the supply amount of the process gas supplied by the gas supply unit 300 per unit time may be increased.

The support unit 200 may support the substrate "W". The support unit 200 may support the substrate "W" in the interior space 101. The support unit 200 may have one of opposite electrodes forming an electric field in the interior space 101. In addition, the support unit 200 may be an electrostatic chuck (ESC) capable of adsorbing and fixing the substrate "W" using electrostatic force.

The support unit 200 may include a dielectric plate 210, an electrostatic electrode 220, a heater 230, a lower electrode 240, and an insulating plate 250.

The dielectric plate 210 may be provided above the support unit 200. The dielectric plate 210 may be made of an insulating material. For example, the dielectric plate 210 may be made of a material including ceramic or quartz. The dielectric plate 210 may have a seating surface supporting the substrate W. When viewed from the top, the dielectric plate 210 may have a seating surface smaller than the bottom surface of the substrate W. A lower surface of the edge region of the substrate "W" placed on the dielectric plate 210 may face an upper surface of an edge ring 710 to be described later.

A first supply passage 211 may be formed in the dielectric plate 210. The first supply passage 211 may be formed to extend from the upper surface to the lower surface of the dielectric plate 210. A plurality of first supply passage 211 are formed spaced apart from each other, and may be provided as passages through which a heat transfer medium is supplied to the lower surface of the substrate "W". For example, the first supply passage 211 may be in fluid communication with a first circulation passage 241 and a second supply passage 243 to be described later.

In addition, a separate electrode (not shown) for adsorbing the substrate "W" onto the dielectric plate 210 may be buried in the dielectric plate 210. A direct current may be applied to the electrode. An electrostatic force acts between the electrode and the substrate by the applied current, and the substrate "W" may be adsorbed onto the dielectric plate 210 by the electrostatic force.

The electrostatic electrode 220 may chuck the substrate "W" by generating electrostatic force. The electrostatic electrode 220 may be provided within the dielectric plate 210. The electrostatic electrode 220 may be embedded in the dielectric plate 210. The electrostatic electrode 220 may be electrically connected to an electrostatic power source 221. The electrostatic power source 221 may selectively chuck the substrate "W" by applying power to the electrostatic electrode 220.

The heater 230 is electrically connected to an external power source (not shown). The heater 230 may generate heat by resisting a current applied from the external power source. The generated heat may be transferred to the substrate "W" through the dielectric plate 210. The substrate "W" may be maintained at a predetermined temperature by the heat generated by the heater 230. The heater 230 may include a spiral coil. The heaters 230 may be embedded in the dielectric plate 210 at regular intervals.

The lower electrode 240 is arranged under the dielectric plate 210. The lower electrode 240 may be an electrode that forms an electric field in the interior space 101. The lower electrode 240 may be any one of opposite electrodes that form an electric field in the interior space 101. The lower electrode 240 may be provided to face an upper electrode 420 to be described later, which is another one of the opposite electrodes. The electric field formed in the interior space 101 by the lower electrode 240 may excite a process gas supplied from the gas supply unit 300 to be described later to generate plasma. The lower electrode 240 may be provided within the dielectric plate 210.

An upper surface of the lower electrode 240 may be stepped such that a central region is positioned higher than an edge region. The central region of the upper surface of the lower electrode 240 may have an area corresponding to the lower surface of the dielectric plate 210 and may be bonded to the lower surface of the dielectric plate 210. The first circulation passage 241, a second circulation passage 242, and the second supply passage 243 may be formed in the lower electrode 240.

The first circulation passage 241 is provided as a passage through which the heat transfer medium is circulated. The heat transfer medium stored in heat transfer medium storage GS may be supplied to the first circulation passage 241 through a medium supply line GL. A medium supply valve GB may be installed in the medium supply line GL. According to the on/off of the medium supply valve GB or the change in the opening rate of the medium supply valve GB, the heat transfer medium is supplied to the first circulation passage 241 or the supply flow rate of the heat transfer medium supplied to the first circulation passage 241 per unit time may be controlled. The heat transfer medium may include helium (He) gas.

The first circulation passage 241 may be formed in a spiral shape inside the lower electrode 240. Alternatively, in the first circulation passage 241, ring-shaped passages having different radii may be arranged to have the same center. The first circulation passages 241 may communicate with each other. The first circulation passages 241 may be formed at the same height.

The second circulation passage 242 may serve as a passage through which a cooling fluid circulates. The cooling fluid stored in a cooling fluid storage CS may be supplied to the second circulation passage 242 through a fluid supply line CL. A fluid supply valve CB may be installed in the fluid supply line CL. According to the on/off of the fluid supply valve CB or the change in the opening rate of the fluid supply valve CB, the cooling fluid may be supplied to the second circulation passage 242 or the supply flow rate of the cooling fluid supplied to the second circulation passage 242 per unit time may be controlled. The cooling fluid may be cooling water or cooling gas. The cooling fluid supplied to the second circulation passage 242 may cool the lower electrode 240 to a predetermined temperature. The lower electrode 240 cooled to the predetermined temperature may maintain the temperature of the dielectric plate 210 and/or the substrate "W" at the predetermined temperature.

The second circulation passage 242 may be formed in a spiral shape inside the lower electrode 240. Alternatively, in the second circulation passage 242, ring-shaped passages having different radii may be arranged to have the same center. The second circulation passages 242 may communicate with each other. The second circulation passage 242 may have a larger cross-sectional area than the first circulation passage 241. The second circulation passages 242 are formed at the same height. The second circulation passage 242 may be located under the first circulation passage 241.

The second supply passage 243 may extend upward from the first circulation passage 241 and may be provided to the upper surface of the lower electrode 240. The second supply passages 243 may be provided in a number corresponding to the number of the first supply passages 211, and the first circulation passage 241 and the first supply passage 211 may be brought into fluid communication with each other.

The insulating plate 250 may be provided under the lower electrode 240. The insulating plate 250 may be provided in a size corresponding to that of the lower electrode 240. The insulating plate 250 may be arranged between the lower electrode 240 and the bottom surface of the chamber 100. The insulating plate 250 may be made of an insulating material and may electrically insulate the lower electrode 240 from the chamber 100.

The gas supply unit 300 may supply a process gas to the chamber 100. The gas supply unit 300 may include gas storage 310, a gas supply line 320, and a gas inlet port 330. The gas supply line 320 may connect the gas storage 310 and the gas inlet port 330 and supply a process gas stored in the gas storage 310 to the gas inlet port 330. The gas inlet port 330 may be installed at a gas supply hole 422 formed in the upper electrode 420.

The upper electrode unit 400 may have the upper electrode 420 facing the lower electrode 240. In addition, the above-described gas supply unit 300 may be connected to the upper electrode unit 400 to provide a part of a supply path of the process gas supplied by the gas supply unit 300. The upper electrode unit 400 may include a support body 410, the upper electrode 420, and a distribution plate 430.

The support body 410 may be fastened to the chamber 100. The support body 410 may be a body to which the upper electrode 420 and the distribution plate 430 of the upper electrode unit 400 are fastened. The support body 410 may be a medium through which the upper electrode 420 and the distribution plate 430 are installed in the chamber 100.

The upper electrode 420 may be an electrode facing the lower electrode 240. The upper electrode 420 may be provided to face the lower electrode 240. An electric field may be formed in a space between the upper electrode 420 and the lower electrode 240. The formed electric field may generate plasma by exciting the process gas supplied to the interior space 101. The upper electrode 420 may be provided in a disk shape. The upper electrode 420 may include an upper plate 420*a* and a lower plate 420*b*. The upper electrode 420 may be grounded. However, it is not limited thereto, and an RF power source (not shown) may be connected to the upper electrode 420 to apply an RF voltage.

The bottom surface of the upper plate 420*a* may be stepped such that the central region is positioned higher than the edge region. Gas supply holes 422 may be formed in the central region of the upper plate 420*a*. The gas supply holes 422 may be connected to the gas inlet port 330 to supply process gas to a buffer space 424. A cooling passage 421 may be formed within the upper plate 420*a*. The cooling passage 421 may be formed in a spiral shape. Alternatively, the cooling passage 421 may be arranged such that ring-shaped passages having different radii have the same center. The temperature control unit 500 to be described later may supply a cooling fluid to the cooling passage 421. The supplied cooling fluid may circulate along the cooling passage 421 and cool the upper plate 420*a*.

The lower plate 420*b* may be arranged under the upper plate 420*a*. The lower plate 420*b* may be provided in a size corresponding to the upper plate 420*a* and positioned to face the upper plate 420*a*. The upper surface of the lower plate 410*b* may be stepped such that the center region is positioned lower than the edge region. The upper surface of the lower plate 420*b* and the lower surface of the upper plate 420*a* may be combined with each other to form the buffer space 424. The buffer space 424 may be provided as a space where a gas supplied through the gas supply holes 422 temporarily stays before being supplied into the chamber 100. Gas supply holes 423 may be formed in the central region of the lower plate 420*b*. A plurality of gas supply holes 423 may be spaced apart at regular intervals. The gas supply holes 423 may be connected to the buffer space 424.

The distribution plate 430 may be arranged under the lower plate 420*b*. The distribution plate 430 may be provided in a disk shape. Distribution holes 431 may be formed in the distribution plate 430. The distribution holes 431 may be provided to extend from the upper surface to the lower surface of the distribution plate 430. The distribution holes

431 may be provided in a number corresponding to the number of the gas supply holes 423 and positioned corresponding to positions at which the gas supply holes 423 are located. The process gas staying in the buffer space 424 may be uniformly supplied into the chamber 100 through the gas supply holes 423 and the distribution holes 431.

The temperature control unit 500 may control the temperature of the upper electrode 420. The temperature control unit 500 may include a heating member 511, a heating power source 513, a filter 515, a cooling fluid supply unit 521, a fluid supply channel 523, and a valve 525.

The heating member 511 may heat the lower plate 420*b*. The heating member 511 may be a heater. The heating member 511 may be a resistive heater. The heating member 511 may be embedded in the lower plate 420*b*. The heating power source 513 may generate power for heating the heating member 511. The heating power source 513 may heat the lower plate 420*b* by heating the heating member 511. The heating power source 513 may be a DC power source. The filter 515 may block transmission of the RF voltage (power) applied by the power source unit 600 to be described later to the heating power source 513.

The cooling fluid supply unit 521 may store cooling fluid for cooling the upper plate 420*a*. The cooling fluid supply unit 521 may supply cooling fluid to the cooling passage 421 through the fluid supply channel 523. The cooling fluid supplied to the cooling passage 421 may lower the temperature of the upper plate 420*a* while flowing along the cooling passage 421. In addition, the fluid valve 525 may be installed in the fluid supply channel 523 to control whether the cooling fluid is supplied to the cooling fluid supply unit 521 or the supply amount of the cooling fluid per unit time. The fluid valve 525 may be an on/off valve or a flow control valve.

The power source unit 600 may apply a radio frequency (RF) voltage to the lower electrode 240. The power source unit 600 may apply an RF voltage to the lower electrode 240 to form an electric field in the interior space 101. The electric field formed in the interior space 101 may generate plasma by exciting process gas supplied to the interior space 101. The power source unit 600 may include a first power source 610, a second power source 620, a third power source 630, and a matching member 640.

The first power source 610 may apply a voltage having a first frequency to the lower electrode 240. The first frequency of a voltage generated by the first power source 610 may be higher than the second frequency and the third frequency of voltages generated by the second power source 620 and the third power source 630 to be described below. The first power source 610 may be a source RF generating plasma in the interior space 101. The first frequency may be 60 MHz.

The first power source 610 may be configured to apply a first sustaining voltage having a first frequency or a first pulse voltage having a first frequency to the lower electrode 240. The first sustaining voltage may be continuous wave (CW) RF. Also, the first pulse voltage may be Pulsed RF.

The second power source 620 may apply a voltage having a second frequency to the lower electrode 240. The second frequency of the voltage generated by the second power source 620 may be smaller than the first frequency of the voltage generated by the first power source 610 described above, and larger than the third frequency of the voltage generated by the third power source 630. The second power source 620 may be a source RF that generates plasma in the interior space 101 in cooperation with the first power source 610. The second frequency may be 2 MHz to 9.8 MHz.

The second power source 620 may be configured to apply a second sustaining voltage having a second frequency or a second pulse voltage having a second frequency to the lower electrode 240. The second sustaining voltage may be continuous wave (CW) RF. Also, the second pulse voltage may be Pulsed RF.

The third power source 630 may apply a voltage having a third frequency to the lower electrode 240. The third frequency of the voltage generated by the third power source 630 may be smaller than the first frequency of the voltage generated by the first power source 610 and the second frequency of the voltage generated by the second power source 620. The third power source 630 may be a bias RF used to accelerate plasma ions in the interior space 101 in cooperation with the first power source 610. The third frequency may be 400 kHz.

The third power source 630 may be configured to apply a third sustaining voltage having a third frequency or a third pulse voltage having a third frequency to the lower electrode 240. The third sustaining voltage may be continuous wave (CW) RF. Also, the third pulse voltage may be Pulsed RF.

The matching member 640 may perform impedance matching. The matching member 640 is connected to the first power source 610, the second power source 620, and the third power source 630 to perform impedance matching with respect to the voltage applied to the lower electrode 240 by the first power source 610, the second power source 620, and the third power source 630.

The ring unit 700 may be disposed on an edge region of the support unit 200. The ring unit 700 may include the edge ring 710, an insulating body 720, and a coupling ring 730.

The edge ring 710 may be disposed under the edge region of the substrate W. At least a portion of the edge ring 710 may be configured to be disposed under the edge region of the substrate "W". The edge ring 710 may have a ring shape as a whole. When viewed from the top, the edge ring 710 may be configured such that a portion of the edge ring 710 overlaps the edge region of the substrate "W" and another portion of the edge ring 710 surrounds the outer periphery of the substrate "W". The upper surface of the edge ring 710 may include an inner upper surface, an outer upper surface, and an inclined upper surface. The inner upper surface may be an upper surface adjacent to the central region of the substrate "W". The outer upper surface may be an upper surface farther from the central region of the substrate "W" than the inner upper surface. The inclined upper surface may be an upper surface provided between the inner upper surface and the outer upper surface. The inclined upper surface may be an upper surface inclined upward in a direction away from the center of the substrate "W". The edge ring 710 may expand an electric field forming region such that the substrate "W" is positioned at the center of an area where plasma is formed. The edge ring 710 may be a focus ring. The edge ring 710 may be made of a material including Si or SiC.

The insulating body 720 may be configured to surround the edge ring 710 when viewed from the top. The insulating body 720 may be made of an insulating material. The insulating body 720 may be provided to contain an insulating material such as quartz or ceramic.

An electric line EL may be connected to the coupling ring 730. The electric line EL may be connected to the filter unit "F" to be described later. The filter unit "F" may be connected to the impedance control unit 800 through an RF cable CA. That is, the coupling ring 730 may be connected to the impedance control unit 800 through the electric line EL and the RF cable CA.

The coupling ring 730 may be disposed under the edge ring 710 and the insulating body 720. The coupling ring 730 may be surrounded by the edge ring 710, the insulating body 720, the lower electrode 240, and the dielectric plate 210. The coupling ring 730 may include a ring body 731 and a ring electrode 732 (an example of a conductive component). The ring body 731 may be made of an insulating material. For example, the ring body 731 may be made of an insulating material such as quartz or ceramic. The ring body 731 may be configured to surround the ring electrode 732. The ring electrode 732 may be made of a conductive material, for example, a material including metal.

The controller 900 may control the substrate processing apparatus 10. The controller 900 may control components of the substrate processing apparatus 10. The controller 900 may control the substrate processing apparatus 10 to perform a harmonic control method to be described later.

The controller 900 may include a process controller including a microprocessor (computer) that performs control on the substrate processing apparatus 10, a user interface including a keyboard through which an operator inputs commands to manage the substrate processing apparatus 10 and the like, a display that visualizes and displays the operation status of the substrate processing apparatus or the like, storage storing a control program for executing processes executed in the substrate processing apparatus 10 under control of a process controller, or a program for causing each component to perform processing according to a variety of data and processing conditions, that is, a processing recipe. Also, the user interface and the storage may be connected to the process controller. The processing recipe may be stored in a storage medium of the storage, and the storage medium may be a hard disk, a portable disk such as a CD-ROM or a DVD, or a semiconductor memory such as a flash memory.

Figure 2:
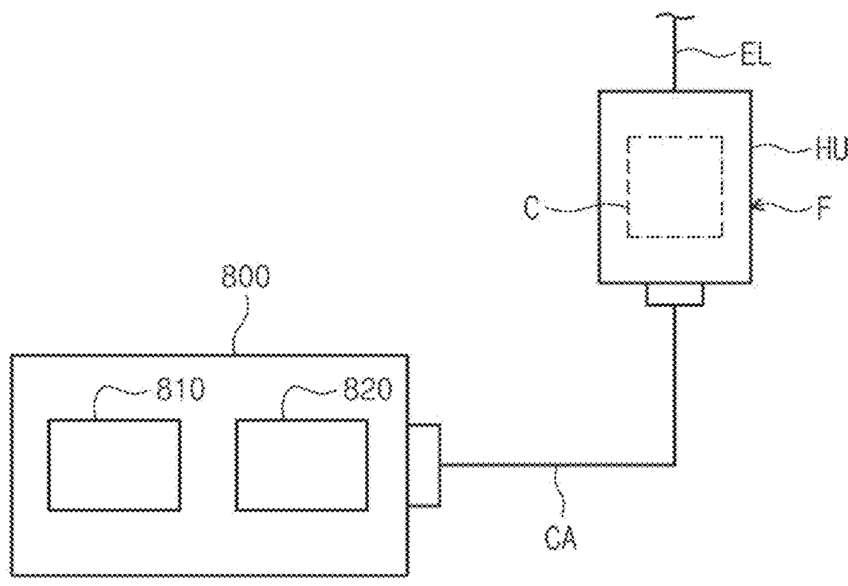
FIG. 2 is a view schematically showing the impedance control unit and the filter unit of FIG. 1.

FIG. 2 is a diagram schematically illustrating the impedance control unit and the filter unit of FIG. 1. Referring to FIG. 2, the impedance control unit 800 according to an embodiment of the inventive concept may include an impedance control circuit 810 and an RF power source 820. Also, the impedance control unit 800 may be electrically connected to the filter unit “F” through the RF cable CA. In addition, the filter unit “F” may be electrically connected to the ring electrode 732 of the coupling ring 730 through the electric line EL. That is, the impedance control unit 800 may be electrically connected to the ring unit 700.

The RF power source 820 of the impedance control unit 800 may apply an RF signal (RF voltage) to the ring electrode 732. The RF power source 820 may apply, for example, a 60 MHz RF voltage to the ring electrode 732. The density of the plasma above the edge region of the substrate “W” may be controlled according to the strength or frequency of the voltage applied by the RF power source 820. For example, when the strength or frequency of the voltage applied by the RF power source 820 increases, the density of plasma may increase.

Also, the impedance control unit 800 may have the impedance control circuit 810. The impedance control circuit 810 may include a variable capacitor. When the capacitance of the variable capacitor is adjusted, a voltage at the upper end of the edge ring 710 may be adjusted. When the voltage at the upper end of the edge ring 710 is adjusted, the incident angle of ions of the plasma at the edge region of the substrate “W” may be adjusted. That is, the flow of plasma may be controlled. The incident angle of ions of the plasma may be determined by a difference between the potential of the upper end of the edge ring 710 and the potential of the upper end of the substrate W. The potential of the upper end of the substrate “W” may be determined by the RF voltage applied by the power source unit 600. The impedance control circuit 810 may adjust the incident angle of ions of the plasma in the edge region of the substrate “W” by adjusting the potential at the upper end of the edge ring 710. That is, the impedance control unit 800 may be electrically connected to the ring unit 700 to adjust the flow or density of the plasma in the edge region of the substrate “W” supported on the support unit 200.

The filter unit “F” may block harmonics that may be generated by the impedance control unit 800 from being transferred to the ring electrode 732 of the ring unit 700. The filter unit “F” may be configured to filter a signal having a frequency that is an integer multiple of the frequency of the RF signal transmitted by the RF power source 820 of the impedance control unit 800. The filter unit “F” may be configured to filter a signal having a frequency three times that of the RF signal transmitted by the RF power source 820, that is, the third harmonic among the harmonics generated by the impedance control unit 800. For example, when a signal generated by the RF power source 820 of the impedance control unit 800 has a frequency of 60 MHz, the impedance control unit 800 may be configured to filter harmonics having a frequency of 180 MHz.

Figure 3:
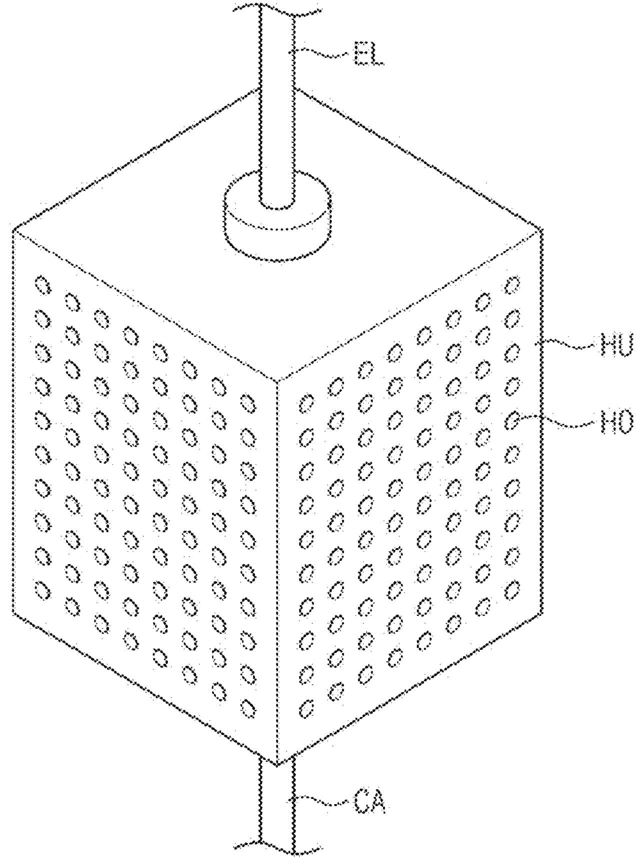
FIG. 3 is a schematic view of a housing of the filter unit of FIG. 2.

The filter unit “F” may include a housing HU having an accommodation space and a filter “C” provided in the accommodation space of the housing HU. As shown in FIG. 3, at least one heat dissipation hole HO may be formed in the housing HU. A plurality of heat dissipation holes HO may be formed. When harmonics are filtered by the filter “C”, the filter “C” may generate heat, and the heat dissipation hole HO may help dissipate the heat generated by the filter “C” to the outside. Also, the housing HU may serve to protect the filter “C” from the outside.

Figure 4:
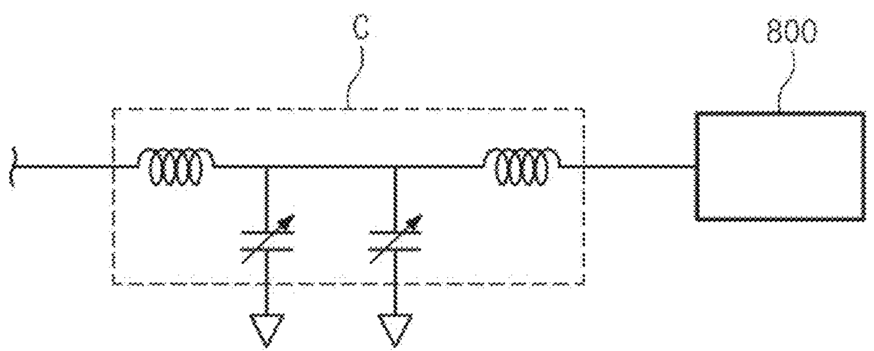
FIG. 4 is a view schematically showing an impedance control circuit of the filter unit of FIG. 2.

In addition, the filter “C” of the filter unit “F” may be provided in combination of at least one or more of a band pass filter, a band reject filter, a low pass filter, a low reject filter, a high pass filter and a high reject filter. The filter “C” may have a cut-off band capable of filtering out harmonic components generated by the impedance control unit 800. As shown in FIG. 4, the filter “C” may be a circuit composed of an inductor and a variable capacitor, and may be configured to remove to an n-th harmonic (120 MHz for the second harmonic, 180 MHz for the third harmonic) via the ground, the n-th harmonic being an integer multiple of 60 Mhz which may be generated by the impedance control unit 800. That is, the filter “C” may filter out harmonics generated by the impedance control unit 800 to prevent the harmonics from being transferred to the ring electrode 732 which is a conductive component. In addition, the filter “C” may be configured to filter out at least one harmonic component of the second harmonic wave and the third harmonic wave. For example, the filter “C” may be configured to filter out the second harmonic, the third harmonic, or both the second and third harmonics. The reason for this is that harmonic components of the fourth harmonic or higher may have a very small effect on the density or flow of plasma.

That is, as the filter unit “F” according to an embodiment of the inventive concept is provided, the harmonic components which may be generated by the impedance control unit 800 may be filtered out not to be transferred to the ring electrode 732 to minimize the effect on control for the density or flow of plasma. Accordingly, it is possible to minimize a problem of deterioration of processing uniformity of the substrate W.

In addition, as described above, as the plasma treatment process for the substrate "W" proceeds, the impedance of the RF cable CA, which is a coaxial cable, may be changed due to deterioration. In general, the impedance of the RF cable CA may refer to the reactance of the RF cable CA at a frequency of 180 MHz (third harmonic of 60 MHz). As described above, this is because harmonics of the fourth harmonic or higher have little effect on the density or flow of plasma.

Table 1 below shows a table in which an impedance (more specifically, reactance) at the frequency of the third harmonic (180 MHz) of the RF cable CA when the filter unit "F" of the inventive concept is not installed is compared with an impedance (more specifically, reactance) at the frequency of the third harmonic (180 MHz) of the RF cable CA and the filter "C" when the filter unit "F" of the inventive concept is installed.

TABLE 1

| Condition | Impedance | Condition | Impedance |
|---|---|---|---|
| Cable | 112 Ohm | Cable + Filter | 55.08 Ohm |
| | 311 Ohm | | 55.43 Ohm |
| | 470 Ohm | | 55.18 Ohm |

Figure 5:
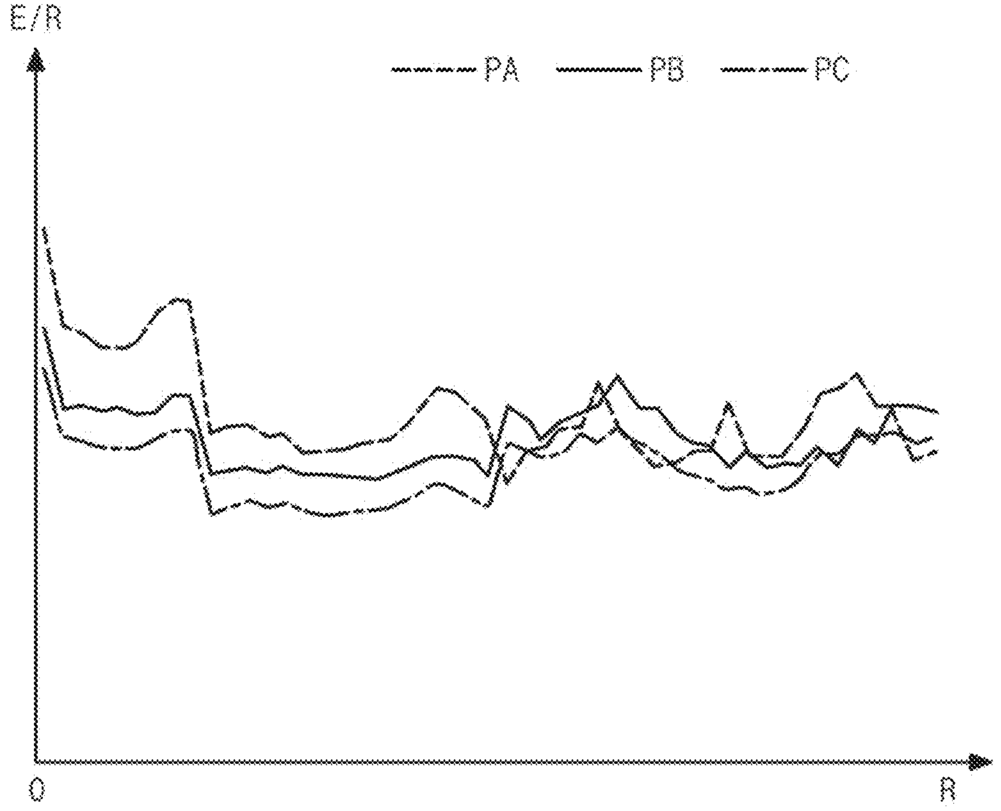
FIG. 5 is a graph showing a degree of substrate treatment according to a degree of deterioration of a cable when a filter unit according to an embodiment of the inventive concept is not installed.
Figure 6:
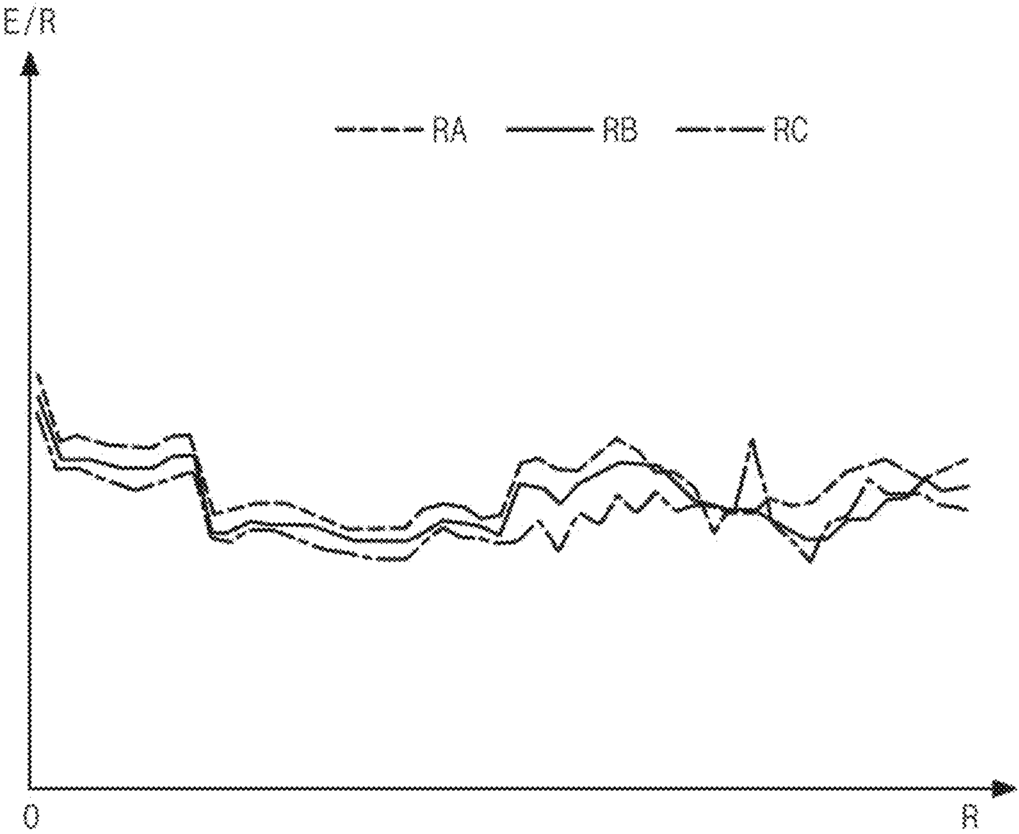
FIG. 6 is a graph showing a degree of substrate treatment according to a degree of deterioration of a cable when a filter unit according to an embodiment of the inventive concept is installed.

When the filter unit "F" is not installed, the RF cables CA may have different impedances depending on the degree of deterioration. For example, a plurality of substrate processing apparatuses 10 may be provided, the impedance of the RF cable CA installed in one of the substrate processing apparatuses 10 may be 112 Ohm, and the impedance of the RF cable CA installed in another of the substrate processing apparatuses 10 may be 311 Ohm, and the impedance of the RF cable CA installed in still another of the substrate processing apparatuses 10 may be 470 Ohm. In this case, etching rates between the substrate processing apparatuses 10 may be different from each other, as shown in FIG. 5. In FIG. 5, the X axis represents a distance from the center of the substrate "W", and the Y axis represents the etching rate for the film on the substrate "W". PA represents the etching rate in the substrate processing apparatus 10 in which the RF cable CA having an impedance of 112 Ohm is installed, PB represents the etching rate in the substrate processing apparatus 10 in which the RF cable CA having an impedance of 311 Ohm is installed, and PC represents the etching rate in the substrate processing apparatus 10 in which the RF cable CA having an impedance of 470 Ohm is installed. When the filter unit "F" is installed, a difference in the filter "C"+the RF cable CA as viewed from the ring electrode 732 may be very small even though the impedances of the RF cables CA vary according to the degree of deterioration. This is because the third harmonic component is removed. For example, a plurality of substrate processing apparatuses 10 are provided, and the impedance of the RF cable CA+filter "C" installed in any one of the substrate processing apparatuses 10 may be 55.08 Ohm, the impedance of the RF cable CA+filter "C" installed in another of the substrate processing apparatuses 10 may be 55.43 Ohm, and the impedance of the RF cable CA+filter "C" installed in still another of the substrate processing apparatuses 10 may be 55.18 Ohm. In this case, the difference in etching rates between the substrate processing apparatuses 10 may be very small, as shown in FIG. 6. In FIG. 6, the X axis represents the distance from the center of the substrate "W", and the Y axis represents the etching rate for the film on the substrate W. RA represents the etching rate in the substrate processing apparatus 10 in which the filter "C"+the RF cable CA having an impedance of 112 Ohm is installed, RB represents the etching rate in the substrate processing apparatus 10 in which the filter "C"+the RF cable CA having an impedance of 311 Ohm is installed, and RC represents the etching rate in the substrate processing apparatus 10 in which the filter "C"+the RF cable CA having an impedance of 470 Ohm is installed. That is, as the filter "C" is installed, even though there is a difference in the degree of degradation of the RF cable CA between the substrate processing apparatuses 10, the occurrence of the deviation in the etching rate between the substrate processing apparatuses 10 may be minimized.

A substrate processing method according to an embodiment of the inventive concept may be implemented in such a way that the controller 900 controls components of the substrate processing apparatus 10. The substrate processing method may include supplying, by the gas supply unit 300, a process gas to the interior space 101 of the chamber 100, and generating plasma by exciting the process gas to process the substrate W.

In this case, the density or flow of plasma delivered to the substrate "W" may be adjusted by adjusting the variable capacitor of the impedance control unit 800 electrically connected to the ring unit 700 disposed under the edge region of the substrate "W", and the filter unit "F" disposed between the impedance control unit 800 and the ring unit 700 may filter out harmonics generated by the impedance control unit 800 to prevent the harmonics from being transferred to the ring electrode 732 of the ring unit 700.

In addition, the filter "C" and the impedance control unit 800 may be electrically connected to each other through the RF cable CA, and the harmonics filtered out by the filter "C" may have a frequency three times the frequency of the RF signal generated by the impedance control unit 800.

In the above example, it has been described that the conductive component is the ring electrode 732 of the ring unit 700 as an example, but is not limited thereto. For example, the conductive component may be transformed into various configurations to be used to adjust the flow or density of plasma delivered to the substrate W.

The above embodiments are presented to help the understanding of the inventive concept, and do not limit the scope of the inventive concept, and it should be understood that various modified embodiments therefrom also fall within the scope of the inventive concept. The drawings provided in the inventive concept merely show an optimal embodiment of the inventive concept. It should be understood that the technical protection scope of the inventive concept should be determined by the technical idea of the claims and is not limited to the literal description of the claims but actually extends to inventive concepts of equivalent technical value.

According to one embodiment of the inventive concept, it is possible to efficiently process the substrate.

In addition, according to an embodiment of the inventive concept, it is possible to improve uniformity of processing for the substrate by plasma.

In addition, according to an embodiment of the inventive concept, it is possible to match substrate processing degrees between substrate processing apparatuses.

In addition, according to an embodiment of the inventive concept, it is possible to improve the uniformity of processing for the substrate even when the impedance of the cable changes.

The effects of the inventive concept are not limited to the above-mentioned effects, and effects not mentioned will be clearly understood by those skilled in the art from this specification and the accompanying drawings.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate processing apparatus, comprising:

a chamber defining an interior space;

a support configured to support a substrate in the interior space;

a ring disposed on an edge region of the support when viewed from above;

an impedance controller electrically connected to the ring to control a flow or density of plasma in an edge region of the substrate;

a filter unit disposed between the ring and the impedance controller; and a cable configured to electrically connect the filter unit and the impedance controller, wherein the impedance controller includes an RF power source configured to transmit an RF signal to the ring; and an impedance control circuit having a variable capacitor and being configured to control a flow or density of the plasma generated above the ring, wherein the filter unit is configured to filter out harmonics generated by the impedance controller to prevent the harmonics from being transferred to the ring, and wherein the filter unit is configured to filter out harmonics generated by the RF power source to prevent the harmonics from being transferred to the ring.

2. The substrate processing apparatus of claim 1, wherein the filter unit is configured to filter out a third harmonic of the harmonics generated by the impedance controller to prevent the third harmonic from being transferred to the ring.

3. The substrate processing apparatus of claim 1, wherein the filter unit includes a housing defining an accommodation space; and a filter in the accommodation space and configured to filter out the harmonics.

4. The substrate processing apparatus of claim 3, wherein the housing defines at least one heat dissipation hole that is configured to dissipate heat generated in the interior space.

5. The substrate processing apparatus of claim 1, wherein the ring further includes an edge ring disposed under the edge region of the substrate and/or in an outer periphery of the edge region of the substrate; and a coupling ring disposed under the edge ring, and wherein the impedance controller is electrically connected to the coupling ring.

6. The substrate processing apparatus of claim 5, wherein the coupling ring includes a ring electrode electrically connected to the impedance controller; and an insulating body configured to surround the ring electrode, the insulating body being made of an insulating material.

7. A substrate processing apparatus using plasma comprising:

a chamber defining an interior space;

a support configured to support a substrate in the interior space;

a power source configured to generate the plasma in the interior space;

a ring configured to adjust a flow or density of the plasma transferred to the substrate;

an impedance controller electrically connected to the ring and configured to adjust an impedance for controlling the flow or density of the plasma transferred to the substrate;

a filter unit disposed between the impedance controller and the ring; and a cable configured to electrically connect the filter unit and the impedance controller, wherein the impedance controller includes an RF power source configured to transmit an RF signal to the ring; and an impedance control circuit configured to adjust the density of the plasma transferred to the substrate, wherein the filter unit is configured to filter out a signal having a frequency of an integer multiple of the RF signal transmitted by the RF power source.

8. The substrate processing apparatus of claim 7, wherein the filter unit is configured to filter out a signal having a frequency three times a frequency of the RF signal transmitted by the RF power source.

9. The substrate processing apparatus of claim 8, further comprising:

a RF cable configured to electrically connect the filter unit and the impedance controller.

10. The substrate processing apparatus of claim 7, wherein the filter unit includes a housing defining an accommodation space; and a filter in the accommodation space to filter harmonics generated by the impedance controller from being transmitted to the ring.

11. The substrate processing apparatus of claim 10, wherein the housing defines at least one heat dissipation hole that is configured to dissipate heat generated by the filter to outside.

12. The substrate processing apparatus of claim 7, the ring including an edge ring disposed under an edge region of the substrate and/or in an outer periphery of the edge region of the substrate.

13. The substrate processing apparatus of claim 12, wherein the edge ring is configured to surround the edge region of the substrate or the outer periphery of the edge region of the substrate when viewed from above, wherein the ring has a ring shape and is disposed below the edge ring.

* * * * *